United States Patent
Usami

(10) Patent No.: US 9,962,802 B2
(45) Date of Patent: May 8, 2018

(54) WORKPIECE DOUBLE-DISC GRINDING METHOD

(71) Applicant: SHIN-ETSU HANDOTAI CO., LTD., Tokyo (JP)

(72) Inventor: Yoshihiro Usami, Nishigo-mura (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 127 days.

(21) Appl. No.: 15/116,130

(22) PCT Filed: Jan. 23, 2015

(86) PCT No.: PCT/JP2015/000295
§ 371 (c)(1),
(2) Date: Aug. 2, 2016

(87) PCT Pub. No.: WO2015/125412
PCT Pub. Date: Aug. 27, 2015

(65) Prior Publication Data
US 2017/0136596 A1    May 18, 2017

(30) Foreign Application Priority Data
Feb. 20, 2014    (JP) .................. 2014-031004

(51) Int. Cl.
*B24B 7/16* (2006.01)
*B24B 7/17* (2006.01)
*H01L 21/02* (2006.01)

(52) U.S. Cl.
CPC .......... *B24B 7/17* (2013.01); *H01L 21/02013* (2013.01); *H01L 21/02024* (2013.01)

(58) Field of Classification Search
CPC  B24B 7/17; B24B 7/228; B24B 37/08; B24B 11/06; B24B 41/04; H01L 21/02024
(Continued)

(56) References Cited

U.S. PATENT DOCUMENTS 3,616,578 A * 11/1971 Clark, Jr. .................. B24B 5/04
                                                              451/142
4,459,453 A *  7/1984 Inoue ....................... B23H 7/08
                                                              219/146.22
(Continued)

FOREIGN PATENT DOCUMENTS

CN        101056741 A    10/2007
CN        101407035 A     4/2009
(Continued)

OTHER PUBLICATIONS

Mar. 15, 2017 Search Report issued in Taiwanese Patent Application No. 104104270.
(Continued)

*Primary Examiner* — George Nguyen
(74) *Attorney, Agent, or Firm* — Oliff PLC

(57) ABSTRACT

The present invention is a workpiece double-disc grinding method including supporting a sheet workpiece along a circumferential direction from an outer circumference side of the workpiece by a ring holder, and simultaneously grinding both surfaces of the workpiece supported by the ring holder with a pair of grinding wheels while rotating the ring holder, wherein the surfaces of the workpiece are simultaneously ground such that a wear amount of the grinding wheels per 1 μm of a grinding stock removal of the workpiece ranges from 0.10 μm to 0.33 μm. This workpiece double-disc grinding method can reduce nanotopography formed in previous steps such as a slicing step without degrading the flatness in the double-disc grinding step.

4 Claims, 5 Drawing Sheets

(58) Field of Classification Search
USPC .................................................. 451/28, 262
See application file for complete search history.

(56) References Cited

U.S. PATENT DOCUMENTS

| | | | | |
|---|---|---|---|---|
| 4,592,172 | A * | 6/1986 | Egusa | B24B 49/04 451/52 |
| 5,643,051 | A * | 7/1997 | Zhou | B24B 5/22 451/11 |
| 5,700,179 | A * | 12/1997 | Hasegawa | B24B 7/06 451/190 |
| 5,837,214 | A * | 11/1998 | Shioi | C04B 35/5831 423/290 |
| 6,191,009 | B1 * | 2/2001 | Tamatsuka | C30B 15/00 148/33 |
| 6,514,424 | B2 * | 2/2003 | Wenski | B24B 37/08 156/345.14 |
| 6,811,465 | B1 * | 11/2004 | Mavro-Michaelis | B24B 1/00 451/11 |
| 8,029,339 | B2 | 10/2011 | Kato et al. | |
| 2002/0052064 | A1 * | 5/2002 | Grabbe | B24B 37/0056 438/113 |
| 2002/0077039 | A1 * | 6/2002 | Wenski | H01L 21/02024 451/41 |
| 2003/0022495 | A1 * | 1/2003 | Netsu | B24B 37/345 438/689 |
| 2005/0142882 | A1 * | 6/2005 | Kida | B24B 9/065 438/692 |
| 2005/0197051 | A1 * | 9/2005 | Takashima | B24B 1/00 451/49 |
| 2008/0299884 | A1 | 12/2008 | Moroto et al. | |
| 2009/0098808 | A1 | 4/2009 | Kajiyama et al. | |
| 2009/0173013 | A1 * | 7/2009 | Kim | B24D 11/001 51/295 |
| 2009/0199404 | A1 * | 8/2009 | Tsukamoto | B24B 5/06 29/898.04 |
| 2011/0053470 | A1 | 3/2011 | Kato et al. | |
| 2015/0147944 | A1 | 5/2015 | Kobayashi | |

FOREIGN PATENT DOCUMENTS

| | | |
|---|---|---|
| CN | 101939136 A | 1/2011 |
| JP | 2000-052209 A | 2/2000 |
| JP | 2007-096015 A | 4/2007 |
| JP | 2007-210054 A | 8/2007 |
| JP | 4420023 B2 | 2/2010 |
| JP | 2013-229586 A | 11/2013 |
| TW | I422465 B | 1/2014 |
| WO | 2014/006818 A1 | 1/2014 |

OTHER PUBLICATIONS

Apr. 12, 2017 Search Report issued in Chinese Patent Application No. 2015800083632.

Mar. 3, 2015 International Search Report issued in International Patent Application No. PCT/JP2015/000295.

* cited by examiner

WORKPIECE DOUBLE-DISC GRINDING METHOD

TECHNICAL FIELD

The present invention relates to a workpiece double-disc grinding method that can reduce nanotopography especially formed in a slicing step.

BACKGROUND ART

In recent years, semiconductor wafers such as silicon wafers have a problem of the magnitude of surface waviness components, which are called "nanotopography". Nanotopography is a kind of surface shapes of semiconductor wafers and shows a wavelength component with λ of 0.2 to 2.0 mm, which is shorter than the wavelength of "Sori" or "Warp" and longer than the wavelength of "surface roughness". The nanotopography has an extremely shallow waviness with a peak-to-valley (PV) value of 0.1 μm to 0.2 μm.

Nanotopography of mirror-polished semiconductor wafers obtained through a double-side polishing step, which is a final step in processing of semiconductor wafers, is usually measured by an optical interference measurement apparatus. However, this reflection interference measurement apparatus fails to measure nanotopography of semiconductor wafers having a non-mirror main surface, which are on an intermediate step, such as a slicing step or a double-disc grinding step, and not subjected to mirror polishing.

Patent Document 1 discloses a method for calculating nanotopography of non-mirror semiconductor wafers by subjecting a warpage shape determined with a capacitive shape measurement apparatus to an arithmetic bandpass filter processing. This method enables simple measurement of nanotopography. A PV value of a cross-sectional shape (a difference between maximum displacement and minimum displacement) is used as a quantitative value of the simplified nanotopography. Hereinafter, this value is referred to as "pseudo-nanotopography".

In addition, silicon wafers are also earnestly required to improve their flatness, as well as nanotopography. While conventional silicon wafers are required to have a flatness (SFQR) of 0.13 μm or less, recent silicon wafers are required to have a flatness (SFQR) of 0.07 μm or less, more strictly 0.04 μm or less.

Nanotopography is formed during processing of wafers (during the period from a slicing step to a polishing step). The nanotopography formed in a slicing step remains until a final step unless reduced in a double-disc grinding step. It is said that the nanotopography affects yields of shallow trench isolation (STI) processes in device production.

Patent Document 2 discloses a method for reducing nanotopography formed in a grinding step. This method includes adjusting the flow rate of a static pressure water to be supplied to a static pressure pad for supporting a wafer without contact in a double-disc grinding apparatus to reduce nanotopography formed in a double-disc grinding step.

CITATION LIST

Patent Literature

Patent Document 1: Japanese Patent No. 4420023
Patent Document 2: Japanese Unexamined Patent publication (Kokai) No. 2007-96015

SUMMARY OF INVENTION

Technical Problem

Although a method for reducing nanotopography formed in a double-disc grinding step has been investigated like the double-disc grinding method disclosed in Patent Document 2, a method for reducing nanotopography formed in other steps such as a slicing step by the double-disc grinding step has been hardly investigated. Thus, no one has yet proposed a double-disc grinding method that can effectively reduce nanotopography formed in steps such as a slicing step.

The present invention was accomplished in view of the above-described problems. It is an object of the present invention to provide a workpiece double-disc grinding method that can reduce nanotopography formed in previous steps such as a slicing step without degrading the flatness in the double-disc grinding step.

Solution to Problem

To achieve this object, the present invention provides a workpiece double-disc grinding method comprising: supporting a sheet workpiece along a circumferential direction from an outer circumference side of the workpiece by a ring holder; and simultaneously grinding both surfaces of the workpiece supported by the ring holder with a pair of grinding wheels while rotating the ring holder, wherein the surfaces of the workpiece are simultaneously ground such that a wear amount of the grinding wheels per 1 μm of a grinding stock removal of the workpiece ranges from 0.10 μm to 0.33 μm.

When the wear amount of the grinding wheels per 1 μm of the grinding stock removal of the workpiece is 0.10 μm or more, nanotopography formed in steps such as a slicing step can be effectively reduced. When the wear amount of the grinding wheels per 1 μm of the grinding stock removal of the workpiece is 0.33 μm or less, the wear amount is not excess. This allows the pair of grinding wheels to be kept parallel, preventing degradation in flatness. Consequently, nanotopography formed in steps such as a slicing step can be effectively reduced without degrading the flatness.

The grinding wheels may be vitrified bond grinding wheels disposed on an outer circumference of an annular core.

Use of such grinding wheels facilitates self-sharpening of the grinding wheels effectively, enabling a reliably and stably continuous grinding.

The wear amount of the grinding wheels per 1 μm of the grinding stock removal of the workpiece may be calculated by dividing a grinding-wheel wear amount by the grinding stock removal that is a difference in workpiece thickness between before and after grinding, the grinding-wheel wear amount being determined from a change in position of the grinding wheels that advance during grinding.

In this manner, the wear amount of the grinding wheels per 1 μm of the grinding stock removal of the workpiece can be readily calculated.

Advantageous Effects of Invention

The inventive workpiece double-disc grinding method can reduce nanotopography formed in steps such as a slicing step without degrading flatness of a ground workpiece. When the nanotopography is reduced by the grinding step in this manner, nanotopography of a surface of a mirror-polished wafer obtained after completion of whole workpiece processing steps can be effectively reduced.

DESCRIPTION OF EMBODIMENTS

Hereinafter, embodiments of the present invention will be described, but the present invention is not limited thereto.

As described previously, no one has yet proposed a double-disc grinding method that can effectively reduce nanotopography formed during processing of wafers by a double-disc grinding step. The nanotopography formed in steps such as a slicing step remains until a final step (a double-side polishing step) unless reduced in a double-disc grinding step. In view of this, the present inventor has focused on grinding wheels used for double-disc grinding and found that as the double-disc grinding wheels wear, the grinding wheels easily catch on a workpiece and difficulty idle. The present inventor then supposes that increasing the wear amount of the double-disc grinding wheels causes the grinding wheels to easily catch on flexion points of a workpiece and grind the flexion points effectively, thereby enabling reduction in nanotopography. On the other hand, the present inventor found that when the grinding wheels excessively wear, the pair of grinding wheels cannot be kept parallel, resulting in degradation in flatness.

Then, the present inventor repeatedly conducted studies and consequently found that setting the wear amount of the grinding wheels per 1 μm of a workpiece grinding stock removal to be 0.10 μm to 0.33 μm enables reduction in nanotopography formed in steps such as a slicing step without degrading flatness of a workpiece, thereby bringing the present invention to completion.

A relationship between nanotopography of a wafer after double-disc grinding and nanotopography of a mirror-polished wafer after whole processing steps will be now described.

Figure 5:
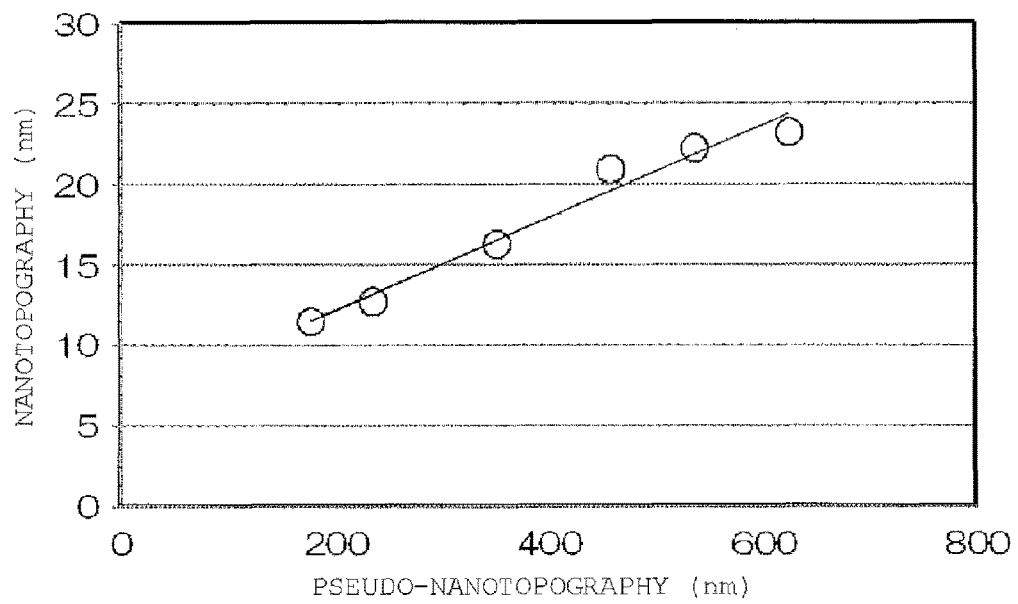
FIG. 5 is a graph showing a relationship between nanotopography after the double-side polishing step and pseudo-nanotopography after the double-disc grinding step.

FIG. 5 is a graph showing a relationship between pseudo-nanotopography of a wafer surface after a double-disc grinding step and nanotopography of a wafer surface that is subjected to an etching step and a double-side polishing step in this order, after the double-disc grinding step. This wafer is a single crystal silicon wafer having a diameter of 300 mm. The pseudo-nanotopography was measured by SBW-330 (made by KOBELCO research institute. Inc.), and the nanotopography was measured by Wafer Sight II (made by KLA-Tencor corporation).

As shown in FIG. 5, nanotopography after the final step increases with the increase of pseudo-nanotopography after double-disc grinding. In brief, there is a correlation between the nanotopography and the pseudo-nanotopography. This indicates that reducing nanotopography formed in steps such as a slicing step by the double-side polishing step, like the present invention, is very effective in improving nanotopography found on the wafer surface after the double-side polishing step.

An exemplary double-disc grinding apparatus used in the inventive double-disc grinding method will be now described with reference to the drawing.

Figure 1:
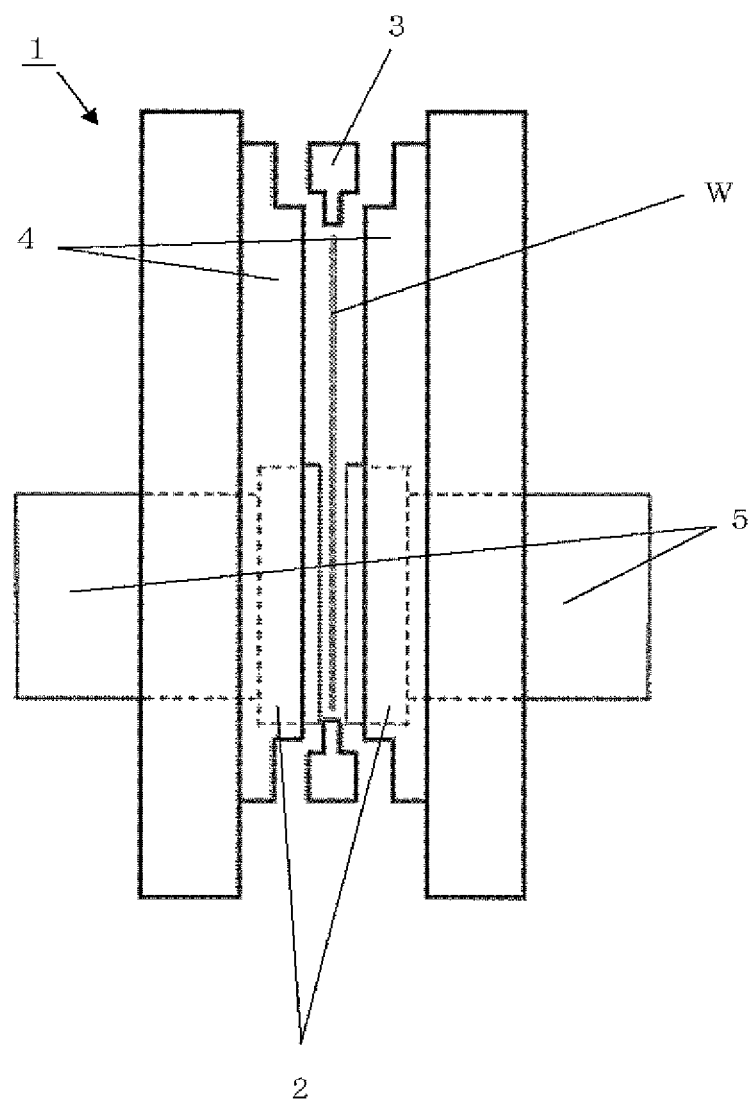
FIG. 1 is a schematic diagram of an exemplary double-disc grinding apparatus used in the double-disc grinding method of the present invention.

As shown in FIG. 1, the double-disc grinding apparatus 1 used in the inventive double-disc grinding method has a pair of grinding wheels 2 for simultaneously grinding both surfaces of a workpiece W, a ring holder 3 configured to hold the workpiece W, and a pair of static pressure supporting members 4 for supporting the ring holder 3 without contact by hydrostatic pressure of fluid.

The grinding wheels 2 are connected with grinding-wheel motors 5 and can rotate at a high speed. The grinding wheel 2 is not particularly limited and may be, for example, a vitrified bond grinding wheel disposed on an outer circumference of an annular core.

The ring holder 3 is configured to hold the workpiece W along a circumferential direction of the workpiece from the outer circumference side, and can rotate. The double-disc grinding apparatus 1 also includes a driving gear (not shown) connecting with a motor not shown. The ring holder 3 can be rotated through the driving gear.

A protrusion is formed on an inner circumference portion of the ring holder 3 so as to extend inward. This protrusion is configured to engage with a groove called a notch formed on the workpiece W. This engagement of the protrusion formed on the ring holder 3 with the notch of the workpiece W enables rotation and holding of the workpiece W.

The material of the ring holder 3 may be for example, but is not particularly limited to, alumina ceramics. The ring holder made of alumina ceramics is excellent in workability, hardly causes thermal expansion during processing, and thus can be processed with high accuracy.

The static pressure supporting member 4 is composed of a holder static pressure portion, located on an outer circumference side, for supporting the ring holder 3 in a contactless manner and a wafer static pressure portion, located on an inner circumference side, for supporting a wafer in a contactless manner. In addition, the static pressure supporting member 4 is provided with a hole into which the driving gear, which is used to rotate the ring holder 3, is inserted and a hole into which the grinding wheel 2 is inserted.

To perform the inventive double-disc grinding method with the double-disc grinding apparatus 1, firstly, a workpiece W is supported along a circumferential direction from the outer circumference side of the workpiece with the ring holder 3. At this time, the protrusion of the ring holder 3 may engage with a notch of the workpiece to support the workpiece.

When the double-disc grinding apparatus 1 includes the static pressure supporting member 4, the ring holder 3 supporting the workpiece is placed between the pair of static pressure supporting members 4 such that the static pressure supporting members 4 and the ring holder 3 have an interval.

A fluid such as water is supplied through the static pressure supporting members 4 to support the ring holder 3 in a contactless manner.

In this way, the ring holder 3 is supported in a contactless manner by supplying a fluid to a space between the static pressure supporting members 4 and the ring holder 3 to stabilize the position of the ring holder 3 that supports the workpiece W during double-disc grinding. The ring holder 3 that supports the workpiece W is then rotated to rotate the workpiece W. The pair of grinding wheels 2 that face the workpiece W are rotated and brought to contact with each surface of the workpiece W. The grinding wheels 2 that face one another are then advanced such that an interval therebetween is gradually reduced while a grinding water is supplied at a predetermined flow rate. The both surfaces of the workpiece W are thereby simultaneously ground.

The grinding wheels 2 used in this method may be vitrified bond grinding wheels disposed on an outer circumference of an annular core.

Use of such grinding wheels facilitates self-sharpening of the grinding wheels effectively, enabling a reliably and stably continuous grinding.

In the present invention, the wear amount of the grinding wheels 2 per 1 μm of a grinding stock removal of the workpiece W is set to be 0.10 μm to 0.33 μm. The wear amount of the grinding wheels 2 can be set by, for example, previously adjusting a load applied to each grinding wheel 2, a rotational speed of the grinding wheels 2, a rotational speed of the workpiece W, and a kind of the grinding wheels 2.

The wear amount of the grinding wheels 2 per 1 μm of the grinding stock removal of the workpiece W can be calculated by dividing a wear amount of the grinding wheels 2 determined from a change in position of the grinding wheels 2 that advance during grinding, by the grinding stock removal that is a difference in workpiece thickness between before and after grinding.

When the wear amount of the grinding wheels per 1 μm of the grinding stock removal of the workpiece is 0.10 μm or more, nanotopography formed in steps such as a slicing step can be effectively reduced. When the wear amount of the grinding wheels per 1 μm of the grinding stock removal of the workpiece is 0.33 μm or less, the pair of grinding wheels 2 can be kept parallel, and thus degradation in flatness can be prevented. Consequently, nanotopography formed in steps such as a slicing step can be effectively reduced in the grinding step without degrading the flatness. This workpiece W, whose nanotopography is reduced in the grinding step, is improved in a nanotopography after the workpiece W is subjected to a final processing step such as a double-side polishing step, thus yielding a mirror-polished wafer that satisfies demands from customers.

EXAMPLE

The present invention will be more specifically described below with reference to examples and comparative examples, but the present invention is not limited to these examples.

Example 1

A double-disc grinding apparatus 1, as shown in FIG. 1, was used to grind single crystal silicon wafers according to the inventive double-disc grinding method. The single crystal silicon wafers, which were obtained by slicing a silicon single crystal ingot produced by a Czochralski method (CZ method), each had a diameter of 300 mm.

Five single crystal silicon wafers to be ground were selected from the single crystal silicon wafers that were sliced out. These five single crystal silicon wafers had a pseudo-nanotopography of 1.0 μm, as measured by SBW-330 (made by KOBELCO research institute. Inc.).

In example 1, the wafers were subjected to double-disc grinding such that the wear amount of the grinding wheels per 1 μm of the grinding stock removal of the workpiece was 0.10 μm.

Figure 2:
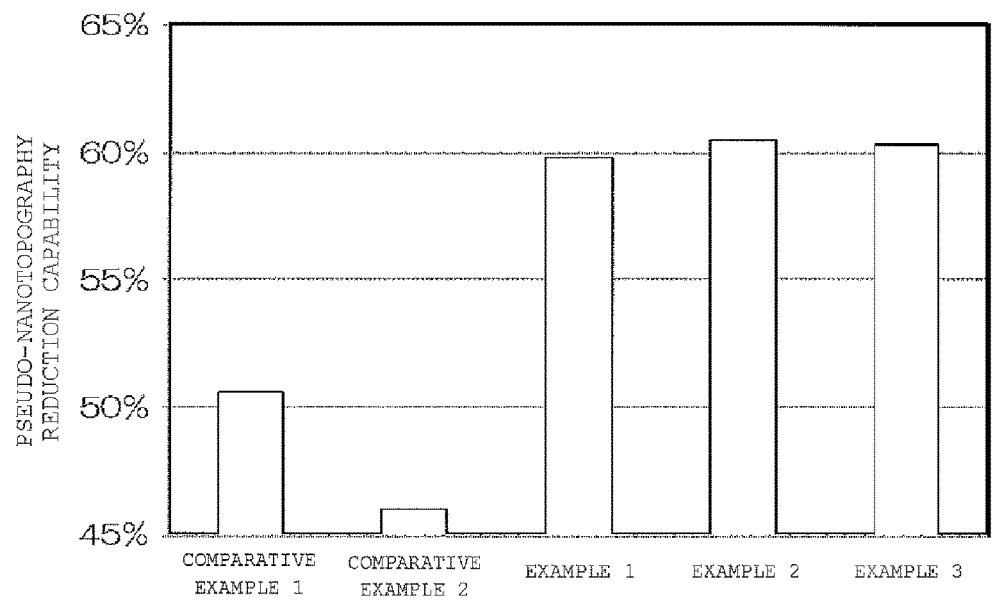
FIG. 2 is a graph showing pseudo-nanotopography reduction capability in examples and comparative examples.

Then, pseudo-nanotopography was measured on the five single crystal silicon wafers subjected to double-disc grinding, by SBW-330 (made by KOBELCO research institute. Inc.). The data obtained from each single crystal silicon wafer was used to calculate pseudo-nanotopography reduction capability through the following expression (1). FIG. 2 shows an average value of the pseudo-nanotopography reduction capability. Herein, the pseudo-nanotopography reduction capability means a reduction in pseudo-nanotopography calculated by the expression (1). The larger this value is, the more pseudo-nanotopography, which is a simplified quantitative value of nanotopography, is reduced.

$$\text{(Pseudo-Nanotopography Reduction Capability)} = \text{(Pseudo-Nanotopography before Grinding} - \text{Pseudo-Nanotopography after Grinding)} / \text{(Pseudo-Nanotopography before Grinding)} \times 100 \quad (1)$$

After measuring the pseudo-nanotopography, the single crystal silicon wafers were subjected to subsequent steps, an etching step and a double-side polishing step in this order, to obtain mirror-polished wafers. Then, nanotopography was measured on the five mirror-polished wafers by Wafer Sight II (made by KLA-Tencor corporation). An average value thereof is given in FIG. 3.

In addition, flatness (SFQR) of these mirror-polished wafers were measured. An average value thereof is given in FIG. 4.

As shown in FIG. 2, the pseudo-nanotopography reduction capability in example 1 was 9.2% higher than that in comparative example 1 described below.

Figure 3:
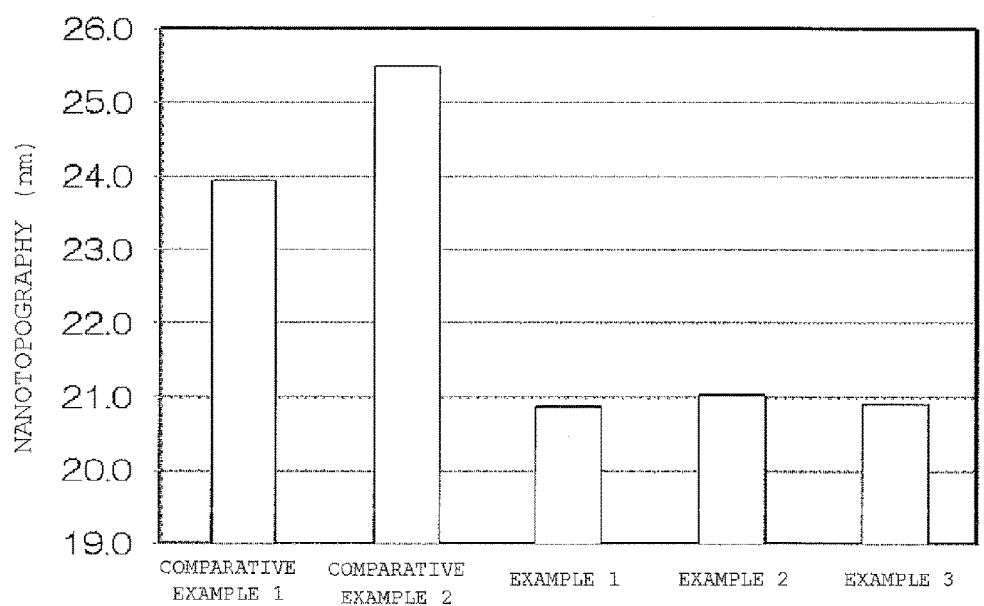
FIG. 3 is a graph showing nanotopography after the double-side polishing step in examples and comparative examples.

Moreover, as shown in FIG. 3, the mirror-polished wafers had a nanotopography 3.1 nm lower than that in comparative example 1 described below.

Figure 4:
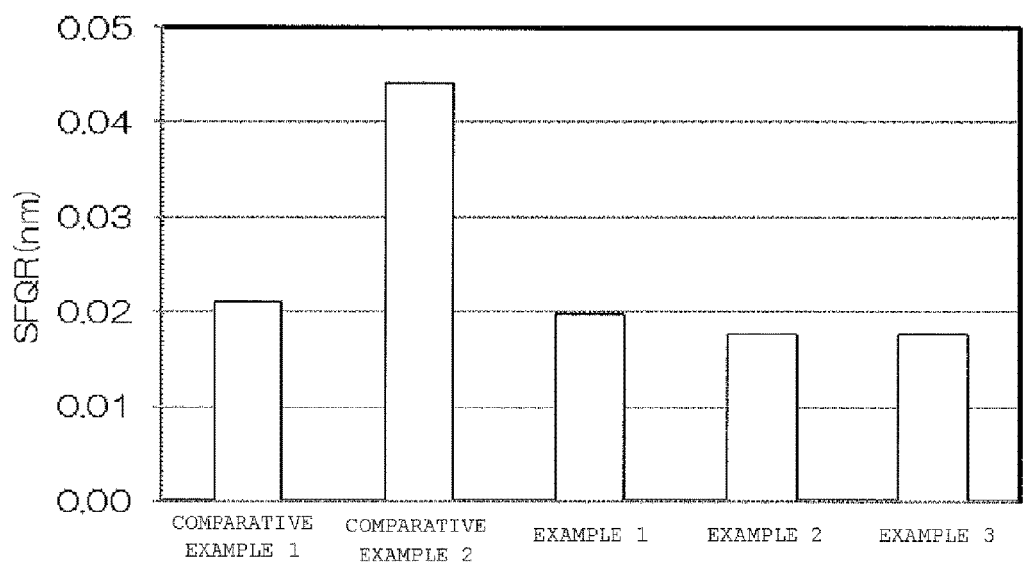
FIG. 4 is a graph showing flatness (SFQR) after the double-side polishing step in examples and comparative examples.

Moreover, as shown in FIG. 4, the mirror-polished wafers had a good flatness (SFQR).

Example 2

Double-disc grinding was performed under the same condition as in example 1 except that the wear amount of the grinding wheels per 1 μm of the grinding stock removal of the workpiece was 0.14 μm. Thereafter, the single crystal silicon wafers were processed under the same condition as in example 1 to obtain mirror-polished wafers.

Moreover, an average value of the pseudo-nanotopography reduction capability, an average value of the nanotopography, and an average value of the flatness (SFQR) were measured as in example 1.

The result is given in FIGS. 2, 3, and 4.

As shown in FIG. 2, the pseudo-nanotopography reduction capability in example 2 was 9.9% higher than that in comparative example 1 described below.

Moreover, as shown in FIG. 3, the mirror-polished wafers had a nanotopography 3.0 nm lower than that in comparative example 1 described below.

Moreover, as shown in FIG. 4, the mirror-polished wafers had a good flatness (SFQR).

Example 3

Double-disc grinding was performed under the same condition as in example 1 except that the wear amount of the grinding wheels per 1 μm of the grinding stock removal of the workpiece was 0.33 μm. Thereafter, the single crystal silicon wafers were processed under the same condition as in example 1 to obtain mirror-polished wafers.

Moreover, an average value of the pseudo-nanotopography reduction capability, an average value of the nanotopography, and an average value of the flatness (SFQR) were measured as in example 1. The result is given in FIGS. 2, 3, and 4.

As shown in FIG. 2, the pseudo-nanotopography reduction capability in example 3 was 9.7% higher than that in comparative example 1 described below.

Moreover, as shown in FIG. 3, the mirror-polished wafers had a nanotopography 3.1 nm lower than that in comparative example 1 described below.

Moreover, as shown in FIG. 4, the mirror-polished wafers had a good flatness (SFQR).

Comparative Example 1

Double-disc grinding was performed under the same condition as in example 1 except that the wear amount of the grinding wheels per 1 μm of the grinding stock removal of the workpiece was 0.08 μm. Thereafter, the single crystal silicon wafers were processed under the same condition as in example 1 to obtain mirror-polished wafers.

Moreover, an average value of the pseudo-nanotopography reduction capability, an average value of the nanotopography, and an average value of the flatness (SFQR) were measured as in example 1. The result is given in FIGS. 2, 3, and 4.

As described previously, the pseudo-nanotopography reduction capability was lower, and the nanotopography of the mirror polished wafers was about 3.0 nm larger than those in examples 1 to 3.

Comparative Example 2

Double-disc grinding was performed under the same condition as in example 1 except that the wear amount of the grinding wheels per 1 μm of the grinding stock removal of the workpiece was 0.40 μm.

In this comparative example, the wear amount of the grinding wheels was so large that the grinding wheels could not be kept parallel to one another during double-disc grinding, and thus the flatness (SFQR) of the mirror-polished wafer significantly degraded as shown in FIG. 4.

Moreover, as shown in FIGS. 2 and 3, the pseudo-nanotopography reduction capability and the nanotopography of the mirror-polished wafers were worse than comparative example 1, and thus greatly worse than examples 1 to 3.

The above examples and comparative examples demonstrated that the inventive double-disc grinding method can reduce nanotopography formed in previous steps without degrading the flatness in the double-disc grinding step, consequently yielding a mirror-polished wafer that exhibits a small nanotopography after completion of whole processing steps.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A workpiece double-disc grinding method comprising:
supporting a sheet workpiece along a circumferential direction from an outer circumference side of the workpiece by a ring holder; and
simultaneously grinding both surfaces of the workpiece supported by the ring holder with a pair of grinding wheels while rotating the ring holder, wherein
the surfaces of the workpiece are simultaneously ground such that a wear amount of the grinding wheels per 1 μm of a grinding stock removal of the workpiece ranges from 0.10 μm to 0.33 μm.

2. The workpiece double-disc grinding method according to claim 1, wherein the grinding wheels are vitrified bond grinding wheels disposed on an outer circumference of an annular core.

3. The workpiece double-disc grinding method according to claim 1, wherein the wear amount of the grinding wheels per 1 μm of the grinding stock removal of the workpiece is calculated by dividing a grinding-wheel wear amount by the grinding stock removal that is a difference in workpiece thickness between before and after grinding, the grinding-wheel wear amount being determined from a change in position of the grinding wheels that advance during grinding.

4. The workpiece double-disc grinding method according to claim 2, wherein the wear amount of the grinding wheels per 1 μm of the grinding stock removal of the workpiece is calculated by dividing a grinding-wheel wear amount by the grinding stock removal that is a difference in workpiece thickness between before and after grinding, the grinding-wheel wear amount being determined from a change in position of the grinding wheels that advance during grinding.

* * * * *